United States Patent
Lai et al.

(10) Patent No.: US 8,053,668 B2
(45) Date of Patent: Nov. 8, 2011

(54) HOUSING STRUCTURE

(75) Inventors: Chin-Chung Lai, Taipei (TW); Mu-Tsai Chang, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 378 days.

(21) Appl. No.: 12/212,080

(22) Filed: Sep. 17, 2008

(65) Prior Publication Data
US 2009/0090532 A1    Apr. 9, 2009

(30) Foreign Application Priority Data

Oct. 9, 2007  (TW) ............................... 96137804 A

(51) Int. Cl.
*H02G 3/08* (2006.01)

(52) U.S. Cl. ........ 174/50; 174/50.5; 174/564; 174/17 R; 220/3.2; 277/641; 277/910

(58) Field of Classification Search ............... 174/50, 174/53, 57, 58, 59, 135, 17 R, 17 VA, 50.5, 174/17 CT, 564; 220/3.2–3.9, 4.02; 248/906; 439/535; 277/600, 640, 641, 642, 910
See application file for complete search history.

(56) References Cited

U.S. PATENT DOCUMENTS

| | | | |
|---|---|---|---|
| 3,643,968 A * | 2/1972 | Horvath ........................ | 277/640 |
| 4,298,204 A * | 11/1981 | Jinkins ........................... | 277/641 |
| 4,599,484 A * | 7/1986 | Bramwell ....................... | 174/50 |
| 4,664,281 A * | 5/1987 | Falk et al. ...................... | 174/50 |
| 4,867,461 A * | 9/1989 | Shimmell ...................... | 277/640 |
| 6,039,323 A * | 3/2000 | Mockenhaupt et al. ....... | 277/600 |
| 6,069,317 A * | 5/2000 | Wagganer ...................... | 220/3.8 |
| 6,492,590 B1 * | 12/2002 | Cheng ............................. | 174/50 |
| 6,659,274 B2 | 12/2003 | Enners | |
| 6,927,334 B2 * | 8/2005 | Lambiaso ....................... | 174/50 |
| 7,208,678 B2 * | 4/2007 | Shinmura et al. .............. | 174/50 |
| 7,423,217 B2 * | 9/2008 | Pape et al. ...................... | 174/50 |

FOREIGN PATENT DOCUMENTS
TW                 483649          4/2002
* cited by examiner

*Primary Examiner* — Angel R Estrada

(57) ABSTRACT

A housing structure includes an upper housing, a lower housing, a first waterproof member and a second waterproof member. The upper housing has a first connecting portion, and the lower housing has a second connecting portion. The upper housing and the lower housing are connected to each other by the first connecting portion and the second connecting portion. The first waterproof member is disposed between the first connecting portion and the second connecting portion. The second waterproof member is disposed between the first connecting portion and the second connecting portion. Wherein, a distance is formed between the first waterproof member and the second waterproof member.

9 Claims, 4 Drawing Sheets

HOUSING STRUCTURE

CROSS REFERENCE TO RELATED APPLICATIONS

This application claims priority of Taiwan Patent Application No. 96137804, filed on Oct. 9, 2007, the entirety of which is incorporated by reference herein.

BACKGROUND OF THE INVENTION

1. Field of the Invention

The invention relates to a housing structure and, more particularly, to a housing structure with a waterproof structure for an electronic device.

2. Description of the Related Art

Please refer to FIG. 1. A conventional housing structure 10 of an electronic device includes an upper housing 11, a lower housing 12 and a waterproof member 13. The waterproof member 13 has a surrounding portion 13C and protrudent portions 13P integrally formed with the surrounding portion 13C. The surrounding portion 13C is disposed around edges of the upper housing 11 and the lower housing 12 along the housing structure 10. Positions of the protrudent portions 13P are corresponding to locking locations of the upper housing 11 and the lower housing 12, respectively. When the upper housing 11 and the lower housing 12 are combined via the locking member 14, the waterproof member 13 can prevent liquid or water vapor from entering into the interior of the housing structure 10 through apertures between the upper housing 11 and the lower housing 12.

Please refer to FIG. 2. The surrounding portion 13C and the protrudent portion 13P of the conventional waterproof member 13 are integrally formed by the rubber. When the upper housing 11 and the lower housing 12 are combined, the locking member 14 exerts an axial locking pressure on the protrudent portion 13P, and the surrounding portion 13C is compressed and deformed, so that the upper housing 11 and the lower housing 12 cannot be tightly fit with the waterproof member 13. Then water vapor is still possible to infiltrate into the electronic device and the objective of waterproofing cannot be achieved.

BRIEF SUMMARY OF THE INVENTION

The invention provides a housing structure including an upper housing, a lower housing, a first waterproof member and a second waterproof member. The upper housing includes a first connecting portion, and the lower housing includes a second connecting portion. The first waterproof member is disposed between the first connecting portion and the second connecting portion. The second waterproof member is disposed between the first connecting portion and the second connecting portion. Wherein, a distance is formed between the first waterproof member and the second waterproof member.

The housing structure of the invention includes a waterproof structure well designed. The first waterproof member and the second waterproof member independently bring a waterproof function into play to fully prevent liquid or water vapor from entering into a seamless space, so that interior electronic components are protected. Compared with a conventional housing which has an integrally formed waterproof member, a distance is formed between the first waterproof member and the second waterproof member in the invention. That is, the first waterproof member and the second waterproof member are independent components, so that when the housing structure is locked, forces are only exerted on the second waterproof member, and the first waterproof member is not affected and deformed. Then the objective of fully waterproofing is further effectively achieved.

DETAILED DESCRIPTION OF THE EMBODIMENTS

Figure 1:
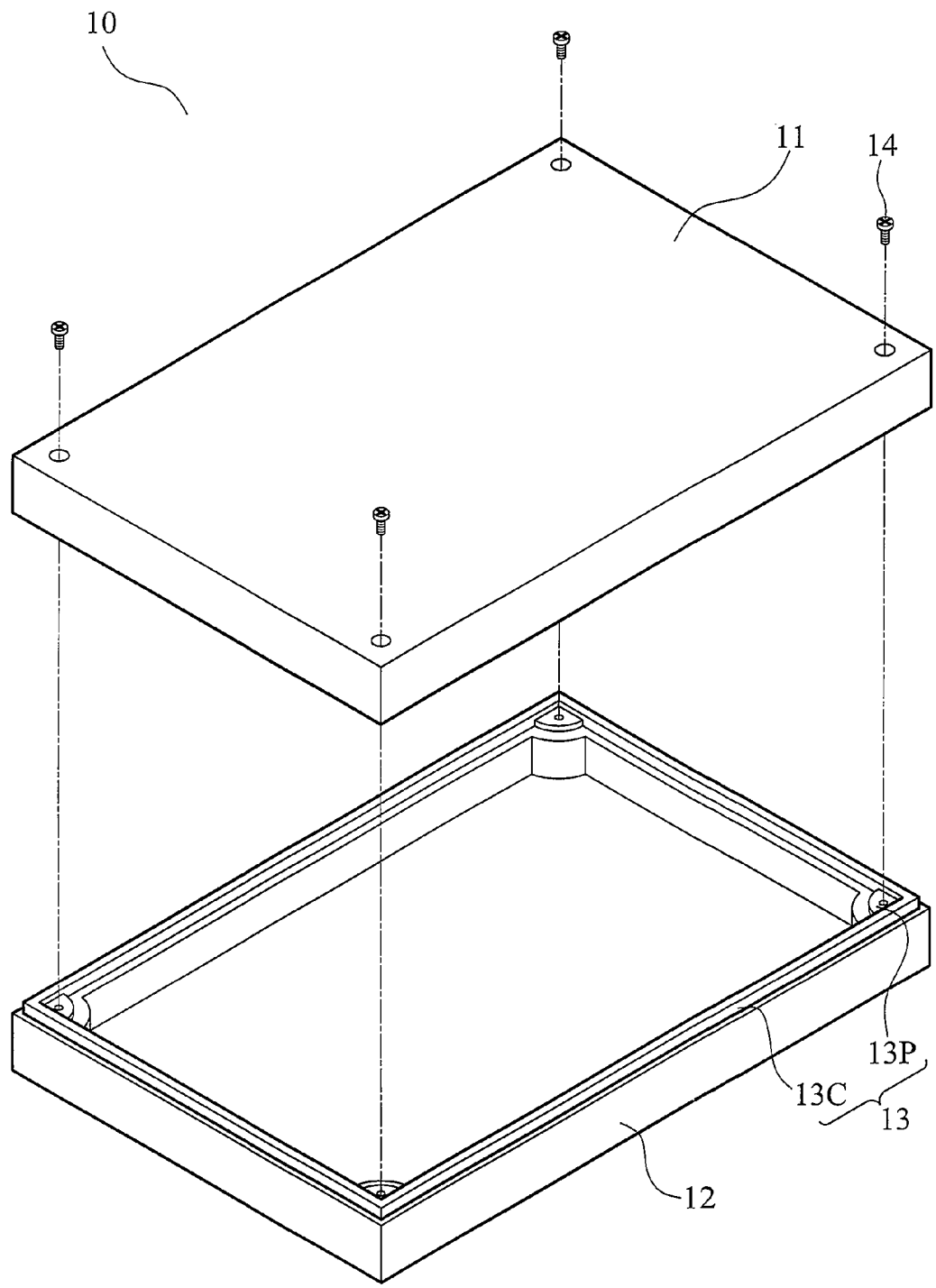
FIG. 1 is a schematic diagram showing a conventional housing structure.
Figure 2:
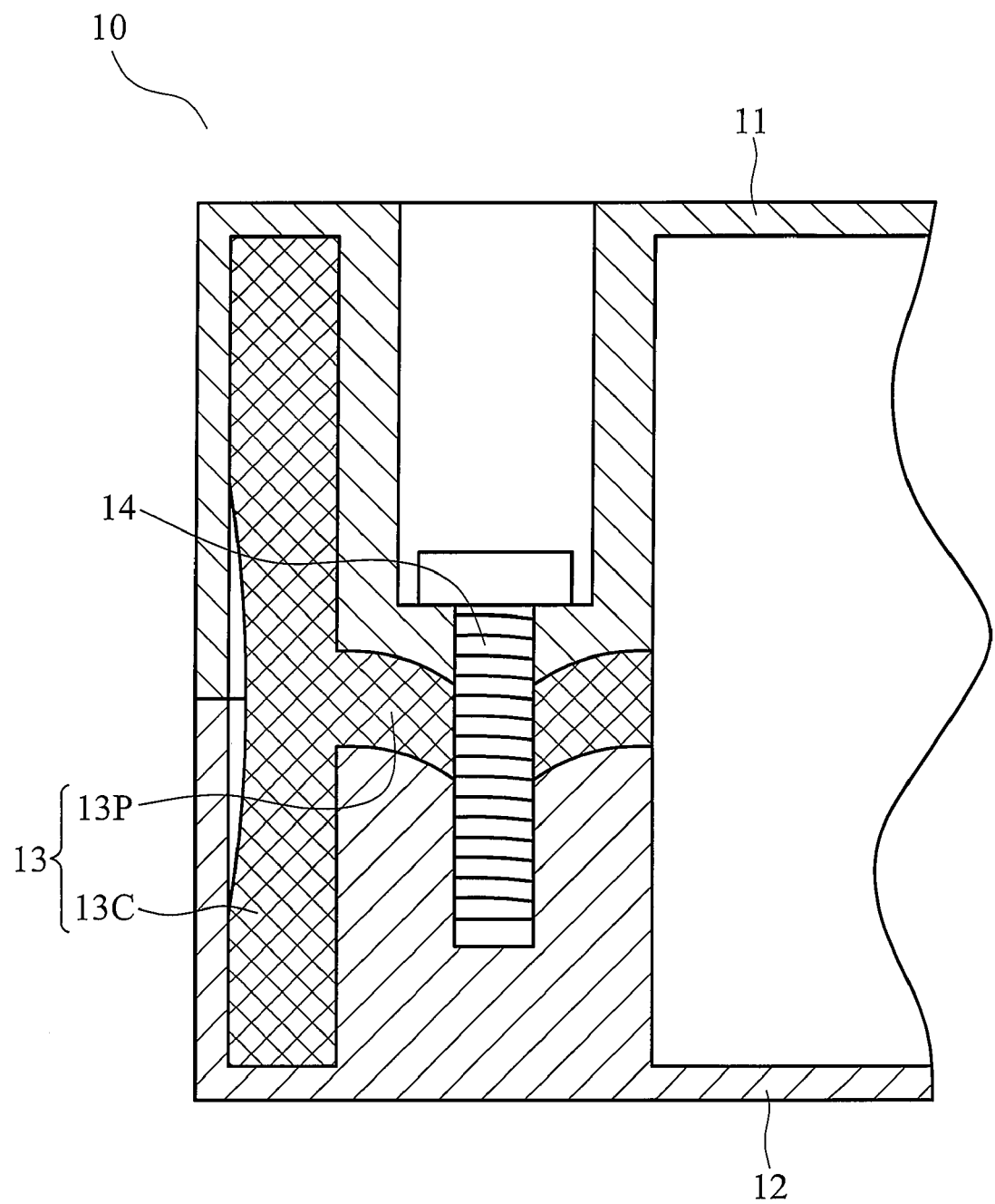
FIG. 2 is a cutaway diagram showing part of a conventional housing structure.
Figure 3:
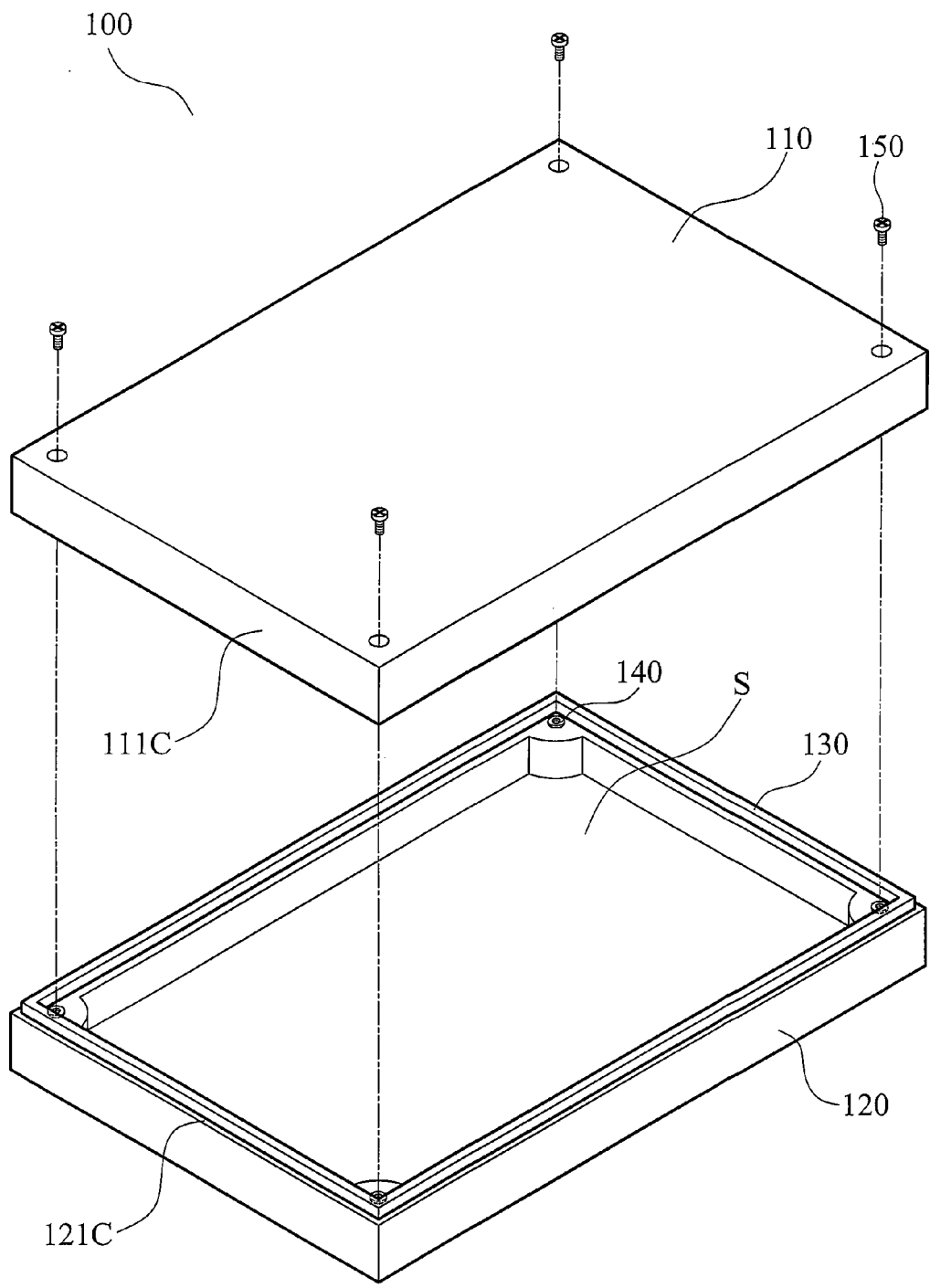
FIG. 3 is a schematic diagram showing a housing structure in a preferred embodiment of the invention.

Please refer to FIG. 3, and a housing structure 100 of the invention can be applied to common electronic products such as mobile phones, personal digital assistants or electronic dictionaries, etc. The housing structure 100 in a preferred embodiment of the invention includes an upper housing 110, a lower housing 120, a first waterproof member 130, a plurality of second waterproof members 140 and a plurality of locking members 150. When the upper housing 110 is combined with the lower housing 120, a seamless space S can be formed in the interior of the housing structure 100 and is used to hold precision electronic components. Liquid and water vapor are fully prevented from entering into the seamless space S because of the first waterproof member 130 and the second waterproof member 140, so that the electronic components are prevented from being affected with damp.

Figure 4:
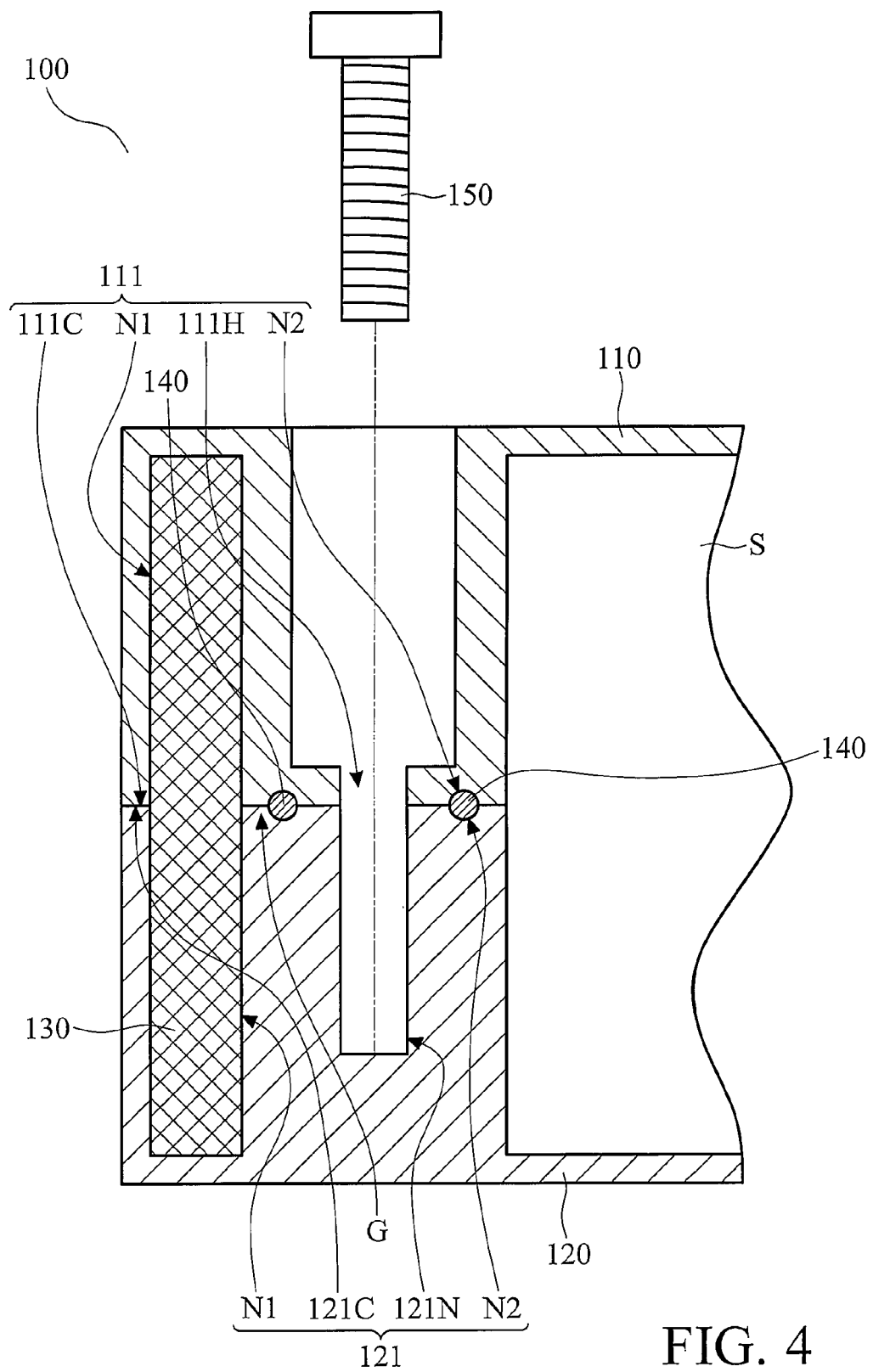
FIG. 4 is a cutaway diagram showing part of a housing structure in a preferred embodiment of the invention.

FIG. 4 is a cutaway diagram showing part of the housing structure 100 when the housing structure 100 is locked. Wherein the upper housing 110 includes a first connecting portion 111 having a first outer edge 111C, a through hole 111H and a first recess N1. The lower housing 120 includes a second connecting portion 121 having a second outer edge 121C, a locking portion 121N and a first recess N1. The first recess N1 of the first connecting portion 111 and the first recess N1 of the second connecting portion 121 are correspondingly formed. The first waterproof member 130 is protrudently disposed in the first recess N1 of the first connecting portion 111 or the second connecting portion 121.

When the housing structure 100 is locked, the locking member 150 passes through the through hole 111H from the upper housing 110 and is locked with the locking portion 121N of the lower housing 120 to fix the upper housing 110 and the lower housing 120. The first waterproof member 130 made of rubber is tightly held between the first recesses N1 of the upper housing 110 and the lower housing 120. Simultaneously, the first outer edge 111C of the upper housing 110 and the second outer edge 121C of the lower housing 120 contact with each other, and a seamless space S is formed in the interior of the housing structure 100. In the embodiment, the first waterproof member 130 is not integrally formed with the through hole 111H or the locking portion 121N. Although the locking portion 150 still has an axial downward pressure because of the locking, the pressure cannot pull the first waterproof member 130 to cause deformity of the first waterproof member 130, and then water vapor cannot infiltrate.

To achieve the objective of further strict waterproofing, the first connecting portion 111 and the second connecting portion 121 further have a second recess N2 circularly formed at the periphery of the through hole 111H, and the second waterproof member 140 is protrudently disposed in the second recess N2. When the locking member 150 passes through the through hole 111H to be locked with the locking portion 121N, the second waterproof members 140 are tightly held between the upper housing 110 and the lower housing 120.

In the embodiment, the second waterproof member 140 can be a circular rubber gasket and is disposed in the second recess N2. The second waterproof member 140 is made of rubber and can be tightly fit with the upper housing 110 and the lower housing 120. When the upper housing 110 is combined with the lower housing 120, the above second recess N2 can be omitted, or only one of the first connecting portion 111 and the second connecting portion 121 needs to have the second recess N2. In addition, the number of the above second waterproof members 140 is corresponding to that of the through hole 111H and the locking portion 121N and is not limited.

The second waterproof member 140 in the embodiment is also independently disposed around the through hole 111H and is not integrally formed with the first waterproof member 130. As a result, when the locking member 150 presses downward along an axis, the waterproof function of the first waterproof member 130 cannot be affected. Water vapor is prevented from infiltrating into the electronic device 100 from the neighborhood of the first waterproof member 130 deformed because of the pull. The second waterproof member 140 disposed around the through hole 111H can further bring a waterproof function into play. The water vapor is prevented from entering into the seamless space S from thin apertures between the locking member 150 and the through hole 111H.

Compared with a conventional housing having an integrally formed waterproof member, a distance G is formed between the first waterproof member 130 and the second waterproof member 140 in the invention. That is, the first waterproof member 130 and the second waterproof member 140 are independent components, so that when the locking member 150 is locked with the locking portion 121N. Pressure is only exerted on the second waterproof member 140, and the first waterproof member 130 is not affected and deformed. Then the objective of fully waterproofing is further effectively achieved.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A housing structure comprising:
   an upper housing having at least a first connecting portion and a first outer edge;
   a lower housing having at least a second connecting portion and a second outer edge;
   a locking member, locked with the second connecting portion;
   a first waterproof member held between the first outer edge and the second outer edge; and
   a second waterproof member held between the first connecting portion and the second connecting portion, wherein the second waterproof member is spaced apart from the locking member, and the first connecting portion and the second connecting portion are in direct contact with each other between the second waterproof member and the locking member;
   wherein the upper housing and the lower housing are connected via the first connecting portion and the second connecting portion, and a distance is formed between the first waterproof member and the second waterproof member.

2. The housing structure according to claim 1, wherein a first recess for holding the first waterproof member is located between the first outer edge and the second outer edge.

3. The housing structure according to claim 1, wherein the first connecting portion has a through hole, and the second connecting portion has a locking portion corresponding to the through hole.

4. The housing structure according to claim 3, wherein the locking member passes through the through hole to be locked with the locking portion.

5. The housing structure according to claim 1, wherein a second recess for holding the second waterproof member is located between the first outer edge and the second outer edge.

6. The housing structure according to claim 3 further comprising a second recess located at the periphery of the through hole and the locking portion.

7. The housing structure according claim 1, wherein the second waterproof member is circular.

8. The housing structure according to claim 1, wherein the first waterproof member is not connected to the second waterproof member.

9. The housing structure according claim 1, wherein both the first connecting portion and the second connecting portion are in direct contact with the second waterproof member.

* * * * *